(12) United States Patent
Cheffings

(10) Patent No.: US 6,320,235 B1
(45) Date of Patent: *Nov. 20, 2001

(54) APPARATUS HAVING LOW RESISTANCE ANGLED IMPLANT REGIONS

(75) Inventor: David F. Cheffings, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/307,459

(22) Filed: May 7, 1999

Related U.S. Application Data

(62) Division of application No. 09/143,602, filed on Aug. 31, 1998, now Pat. No. 5,976,960, which is a continuation of application No. 08/975,203, filed on Nov. 20, 1997, now Pat. No. 5,858,845, which is a continuation of application No. 08/313,628, filed on Sep. 27, 1994, now abandoned, which is a division of application No. 08/021,271, filed on Feb. 22, 1993, now Pat. No. 5,378,641.

(51) Int. Cl.[7] .......................... H01L 29/76; H01L 29/94; H01L 31/062; H01L 31/113; H01L 31/119
(52) U.S. Cl. ........................................ 257/382; 257/347
(58) Field of Search .................... 257/382, 347

(56) References Cited

U.S. PATENT DOCUMENTS

| 4,443,931 | 4/1984 | Baliga et al. ........................ 437/149 |
| 4,513,494 | 4/1985 | Batra ..................................... 437/45 |
| 5,013,673 | 5/1991 | Fuse ...................................... 437/35 |
| 5,019,888 | 5/1991 | Scott et al. .......................... 257/379 |
| 5,126,285 | 6/1992 | Kosa et al. .......................... 437/191 |
| 5,158,903 | 10/1992 | Hora et al. .......................... 437/35 |
| 5,177,030 | 1/1993 | Lee et al. ............................ 437/35 |
| 5,206,535 | 4/1993 | Namose ............................. 257/550 |
| 5,217,910 | 6/1993 | Shimizu et al. .................... 437/149 |
| 5,223,445 | 6/1993 | Fuse .................................... 437/44 |
| 5,270,249 | 12/1993 | Fukuma ............................. 437/45 |
| 5,285,093 | 2/1994 | Lage et al. ......................... 257/401 |
| 5,317,197 | 5/1994 | Roberts ............................. 257/401 |
| 5,596,215 | * 1/1997 | Huang ............................... 257/382 |
| 5,612,243 | * 3/1997 | Verrett .............................. 437/57 |
| 5,612,557 | * 3/1997 | Kondo et al. ..................... 257/288 |
| 5,612,563 | * 3/1997 | Fitch et al. ........................ 257/329 |
| 5,742,088 | * 4/1998 | Pan et al. .......................... 257/382 |
| 5,952,720 | * 9/1999 | Chang ............................... 257/382 |

FOREIGN PATENT DOCUMENTS

| 1-238062 | 9/1989 | (JP) ...................................... 257/343 |
| 60113967 | 6/1985 | (JP) ...................................... 437/149 |
| 62113474 | 5/1987 | (JP) ...................................... 437/35 |
| 3262130 | 11/1991 | (JP) ...................................... 437/35 |
| 536719 | 2/1993 | (JP) ...................................... 437/35 |
| 5212542 | 5/1993 | (JP) ...................................... 437/35 |

* cited by examiner

*Primary Examiner*—Ngân V. Ngô
(74) *Attorney, Agent, or Firm*—Schwegman, Lundberg, Woessner & Kluth, P.A.

(57) ABSTRACT

The invention is a semiconductor memory structure having an electrically conductive substrate interconnect formed to provide electrical continuity between a buried contact region and a source/drain region of a transistor without overlap of the buried contact region with the source/drain region. The electrically conductive substrate interconnect is formed during an ion bombardment of the substrate wherein the ions enter the substrate at an oblique angle and underlie at least a portion of a region utilized to control the amount of ions entering the substrate.

39 Claims, 3 Drawing Sheets

APPARATUS HAVING LOW RESISTANCE ANGLED IMPLANT REGIONS

This application is a divisional of U.S. Ser. No. 09/143,602 filed Aug. 31, 1998, now U.S. Pat. No. 5,976,960 which is a continuation of U.S. Ser. No. 08/975,203 filed Nov. 20, 1997, now U.S. Pat. No. 5,858,845, which is a continuation of U.S. Ser. No. 08/313,628, filed Sep. 27, 1994 now abandoned, which is a divisional of Ser. No. 08/021,271, filed Feb. 22, 1993 now U.S. Pat. No. 5,378,641.

FIELD OF THE INVENTION

The invention relates to semiconductor memory devices, and more particularly to an electrically conductive substrate interconnect formed in the substrate with an angled implant in a device such as a static random access memory device (SRAM).

BACKGROUND OF THE INVENTION

Static random access memory (SRAM) devices are electronic memory devices that store digital information or data in an arrangement of memory cells. Unlike ordinary, volatile memory devices, static memory devices retain their contents without a refresh cycle. It is interesting to note that a trickle of electrical current, such as the amount of current that would not significantly affect the battery life of a conventional battery, is enough current to maintain the contents of a memory cell of an SRAM.

NMOS and PMOS transistors are formed in SRAM devices. Typically the gates of these transistors overly a substrate and the source/drain regions of the transistors are formed in the substrate. It is necessary to provide an electrical potential to the source/region in order for the transistor to operate. In SRAM fabrication a buried contact region is formed in the substrate. A conductive layer is deposited on the buried contact region. The conductive layer is connectable to an electrical potential. Therefore in order to connect the electrical potential to the source/drain region through the buried contact region there must be an electrical connection between the buried contact region and the source/drain region. In the related art, shown in FIG. 1, the source/drain region 1 and the buried contact region 2 overlap thereby providing the electrical connection in area 3. There are several disadvantages inherent in the structure formed by this process. First the conductive layer 4 is etched to expose the substrate in order to form the source/drain region 1. Since the etch is not selective over silicon, a typical substrate material, the substrate 5 is inadvertently etched forming a small trench 6. The formation of the trench 6 necessitates careful manipulation of the process to ensure that the trench 6 does not isolate the buried contact region 2 from the source/drain region 1 or result in side effects such as junction leakage from damage in the silicon substrate. If indeed the trench isolates the two regions the substrate will provide a high resistance path between the two regions. Without proper trench control, yield problems increase and more parts fail. As in any competitive industry, there exists a need to increase yield thereby decreasing costs.

OBJECTS OF THE INVENTION

It is an object of the invention to increase yield and decrease the cost of producing a static random access memory (SRAM) device. The invention features an electrically conductive substrate interconnect and features an angle implant for forming the electrically conductive substrate interconnect. Typically the electrically conductive substrate interconnect provides electrical communication between a buried contact region and the source/drain region of a transistor. The interconnect region provides a low resistance path between the buried contact region and the source/drain region while avoiding the formation of a trench, thereby eliminating potential junction leakage and increasing-yield.

SUMMARY OF THE INVENTION

In a first embodiment the invention is method for forming a low resistance region in a substrate using an angled implant.

In a second embodiment the invention is a semiconductor structure, and the method for fabricating the structure, comprising an electrically conductive substrate interconnect for providing electrical continuity to two non-overlapping electrical regions of the substrate. The electrically conductive substrate interconnect is formed underlying at least a portion of a control region during an angle implant. During the angle implant the substrate is bombarded with ions which enter the substrate at an oblique angle to a face plane of the substrate. The amount of ions entering the substrate and the depth to which the ions are driven is controlled by the depth and composition of the control region, the composition of the substrate, the energy and species of the ions, and by the implant angle of the angled implant.

BRIEF DESCRIPTION OF THE DRAWINGS

In FIG. 2 buried contact regions are defined in the semiconductor structure.

FIG. 3 depicts the semiconductor structure of FIG. 2 following the formation of angled implant regions.

FIG. 4 is an enlarged portion of the semiconductor structure of FIG. 3.

FIG. 5 depicts the semiconductor structure of FIG. 3. following the formation of a buried contact region and patterning of source/drain regions.

FIG. 6 depicts the semiconductor structure of FIG. 5 following the formation of a lightly doped terminal in the substrate.

FIG. 7 depicts the semiconductor structure of the FIG. 6 following the formation of spacers and the heavy doping of a source-drain region.

DETAILED DESCRIPTION OF THE INVENTION

The invention is an electrically conductive substrate interconnect having continuity with a buried contact region of the substrate and continuity with an electrical terminal fabricated in the substrate and distanced from the buried contact region and the method for forming same. The buried contact region and the electrical terminal do not physically overlap one another and electrical communication is provided between the two by the electrically conductive substrate interconnect. The buried contact region provides an area for an overlying electrical connection which is typically doped polysilicon. The doped polysilicon is connectable to an electrical potential.

Figure 1:
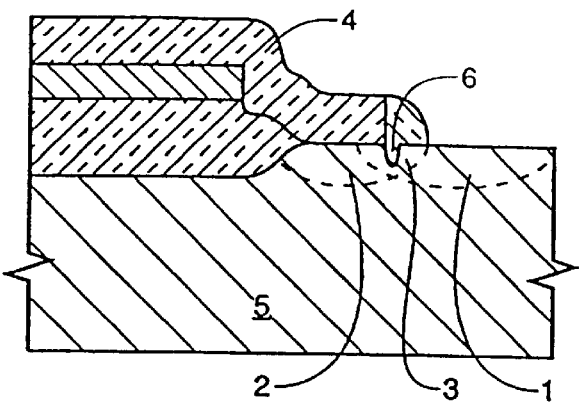
FIG. 1 is a cross sectional portion of a semiconductor structure of the related art.
Figure 2:
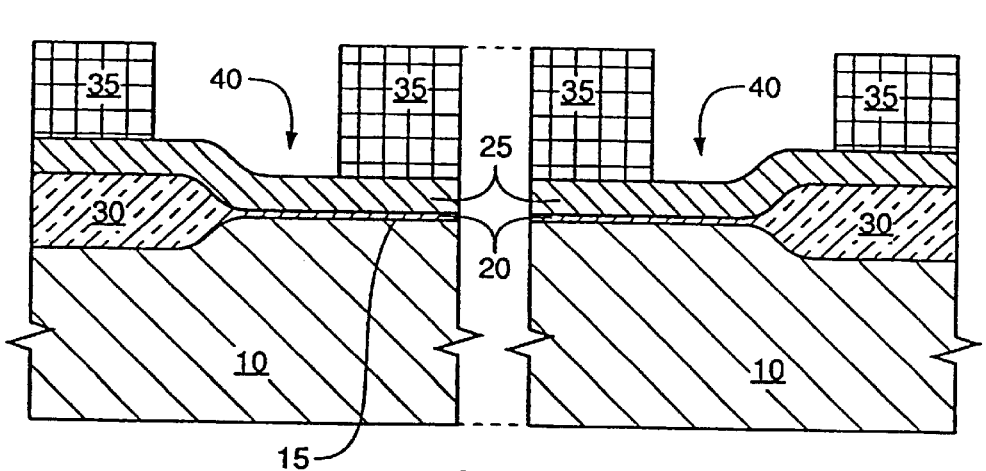
FIGS. 2–7 are segmented cross sectional portions of a semiconductor structure depicting the process of the invention.

The fabrication steps have been consolidated pictorially in FIGS. 2–7. Shown in FIG. 2 is a cross sectional representation of a portion of a semiconductor structure 7 comprised of a silicon substrate 10 having a surface 15, a thin oxide layer 20 of a thickness, for example, of about 200 Angstroms on surface 15, a polysilicon layer 25, of a thickness, for example, of about 1K Angstroms on oxide layer 20, field oxide 30, and a photoresist pattern 35 defining future buried contact regions of the substrate 10 with openings 40. Substrate 10 is lightly doped as P-type for the presently described embodiment in anticipation of making N channel transistors but could also be N-type for making P channel transistors. The substrate 10 could also be a well within a larger semiconductor substrate. Alternately a silicon on insulator (SOI) structure could replace the silicon substrate. The semiconductor structure 7 of FIG. 2 is obtained by conventional means well known to those skilled in the art. The field oxide 30 is formed in isolation areas, and oxide layer 20, also known as gate oxide, is grown on the exposed surface 15 of substrate 10. Gate oxide provides a protection against diffusion and provides etch stop functions. The polysilicon layer 25 is deposited, and photoresist 35 is patterned to create openings 40 which define areas to be etched.

Figure 3:
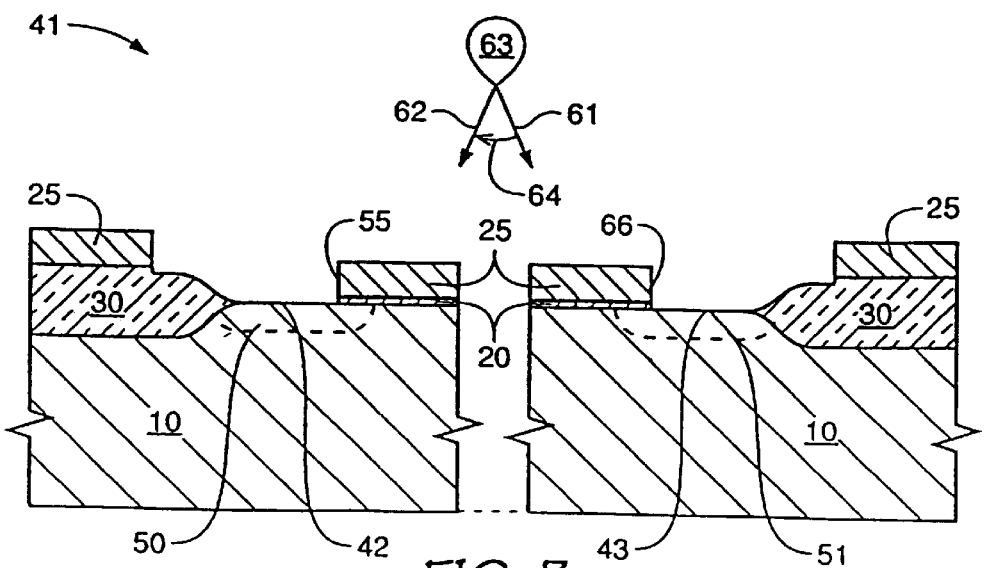

The semiconductor structure 41 of FIG. 3 is obtained according to further process steps comprising an etch of polysilicon layer 25 in the openings 40 defined by the photoresist mask 35 shown in FIG. 2. The oxide layer 20 is etched according to a mask formed by the etched polysilicon layer 25. The etch is preferably anisotropic, such as a reactive ion etch (RIE) to avoid etching oxide under polysilicon layer 25. An isotropic etch which is carefully controlled may also be used. In either case a portion of the field oxide is inadvertently etched with the gate oxide. The polysilicon and oxide etches expose portions 42 and 43 of substrate 10. The polysilicon layer 25 and oxide layer-20 protected during the etching processes are retained.

Ion implants are utilized in semiconductor manufacture to "dope" a layer to a desired conductivity. If an N-type layer is created during the implant there are more negative ions than positive ions in the layer, and conversely if a P-type layer is created during the implant there are more positive ions than negative ions in the layer. The ion concentrations are often rated with respect to one another. In this discussion a light concentration is designated as n− or p−. A very heavy concentration is designated n++ or p++ and an intermediate concentration is designated n+ or p+.

During an ion implant gas ions are energized and driven into a semiconductor structure in a controlled direction by an ion accelerator. A wafer containing a semiconductor structure is mounted on a platen during fabrication. The implant angle is the angle formed between a normal to the platen and the trajectory of the accelerated ions and measured from the normal to the trajectory. Although microscopically the surface of the substrate is irregular, it can be thought of as being substantially planar on a larger scale. Therefore the implant angle is also the angle measured from a normal to the face plane of the substrate and the trajectory of an energized ion.

During a typical ion implant the implant angle is equal to 0 degrees, and the entire wafer is bombarded with ions. There are several methods used to effect this coverage including moving the wafer with respect to a fixed beam or moving the beam of ions with respect to the wafer. The actual methods are well known to those skilled in the art.

Still referring to FIG. 3, the photoresist mask 35 shown in FIG. 2 has been removed, and the semiconductor structure 42 is subjected to a phosphine angled ion implant. During an angled ion implant the implant angle is greater than 0 degrees and less than 90 degrees. The energized ions enter the substrate 10 and create N+ angled implant regions 50 and 51 in portions of exposed substrate 10 and underlying portions of the polysilicon layer 25. The polysilicon layer 25 is a control layer used as a mask for allowing ion penetration of the substrate in the buried contact region and for controlling ion penetration underlying the polysilicon layer 25. In an alternative embodiment the oxide layer 20 may be etched subsequent to the angled implant rather than prior to the implant.

A control layer is a layer of material which controls the depth energized ions are implanted in a substrate subsequent to passing through the control layer. As the distance through which the ions pass through the control layer increases the distance that the ions penetrate the substrate decreases. The critical distance is the minimum distance that the ions must travel through the control layer such that ion penetration of the substrate is prohibited. The critical distance is dependent on the composition of the control layer, the composition of the substrate, and the energy and species of the ions. In the present invention it is important that the control layer prohibit doping of the substrate area defined by the transistor gate.

Figure 4:
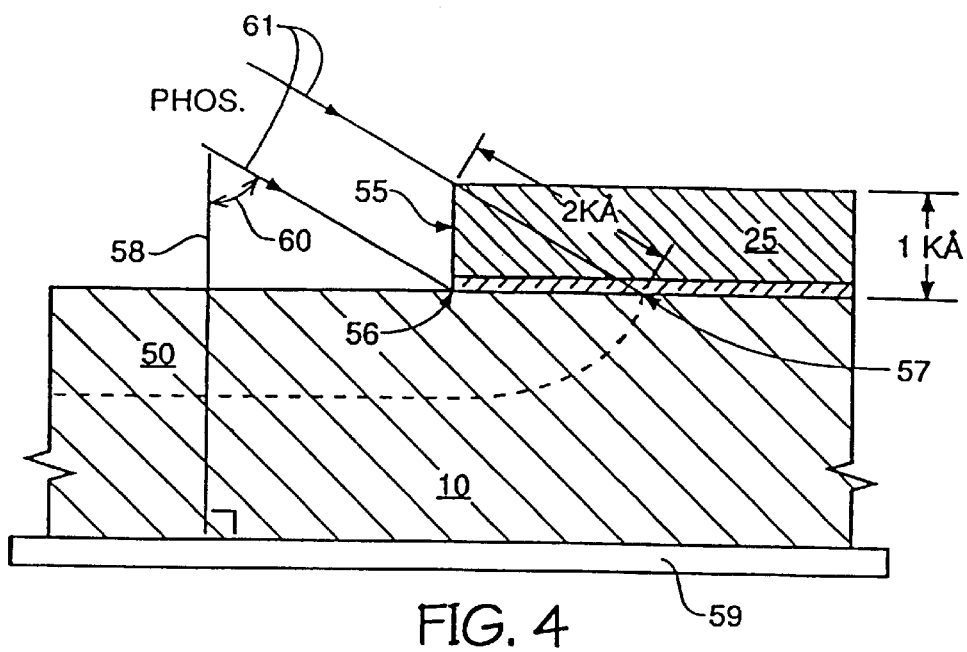

In preface to a further discussion of the angled implant relevant terms are hereby defined with respect to FIG. 4, which is an enlarged view of a portion of FIG. 3.

The polysilicon layer 25 is a control layer having an exposed edge 55. A plane containing the exposed edge 55 intersects the substrate at a critical line 56. The terminal line 57 is the line underlying the control layer at which ion penetration of the substrate ceases. In the cross sectional view of FIG. 4 the terminal line looks like a point but would actually be a line normal to the paper at the point indicated by 57. Line 58 represents a normal to the platen 59.

Following is a brief description of the process with respect to the conditions which determine the characteristics of the electrically-conductive substrate interconnect. As the ions, accelerated during the angled implant, enter the polysilicon layer 25 at increasing distances from the critical line 56 the distance that the ions must travel through the polysilicon from the point of incidence to the point of exit increases. As this distance increases the distance the ions penetrate the substrate 10 decreases until the critical distance of the control layer is reached, and ion penetration into the substrate 1 ceases. In FIG. 4 the dashed-lines indicate the maximum depth that the ions penetrate the substrate in angled implant region 50. It can be seen that when the ions do not pass through the control layer, in this case polysilicon layer 25, there is maximum ion penetration of the substrate. As the ions pass through increasing distances of the polysilicon layer 25 the depth of the ion penetration decreases until there is no ion penetration of the substrate at terminal line 57. At terminal line 57 the ions were blocked by the critical distance of the control layer. Thus the depth and composition of the conductive layer, the composition of the substrate, the energy and species of the ion bombardment, and the implant angle 60 control the length, depth, shape, and conductive characteristics of the angled implant regions 50 and are therefore controllable by the individual designer.

Referring again to FIG. 3 it can be seen that it is important for the designer to control the implant angle so that the entire edge 55 is subjected to the accelerated ions. For example, if the designer were to use too large an implant angle it is possible that a structure such as layer 25 overlying field oxide 30 could block a beam at the critical line. Further increases in the implant angle would result in additional portions of the edge 55 experiencing no ion bombardment. A result would, of course, be an unwanted high resistance region underlying the control layer where no dopants were implanted.

Although polysilicon layers of various depths and ion implants having various species and energies can be used to implement the invention, an example of a first angled implant 61 is herein described with respect to FIG. 4. In the example the polysilicon layer 25 is chosen to have a depth of 1 KÅ and the energy of a phosphine implant is chosen to be 45 Kev. It is known that 2 KÅ of polysilicon will prohibit phosphine ions having an energy of 45 Kev from entering the substrate 10. In order to prohibit the accelerated ions from entering the substrate the minimum implant angle would have to be 60 degrees for the given polysilicon layer and energy of the example. Under these circumstances ions penetrate the substrate 10 up to a distance of 1.723 KÅ measured along the substrate surface 15 from the critical line 56 to the terminal line 57. It should be noted that the distance between the critical line 56 and the terminal line 57 must be designed so as to be greater than or equal to the worst case misalignment for defining source/drain areas. It can be seen that a polysilicon layer having a depth greater than 1 KÅ for a 45 Kev bombardment having an implant angle of 60 degrees would effect an angled implant region having the same characteristics as would a similar bombardment of a polysilicon layer having a depth-equal to 1 KÅ. It can also be seen that a polysilicon layer having a depth less than 1 KÅ for a 45 Kev bombardment having an implant angle of 60 degrees would result in ions penetrating the entire surface area of the substrate 10.

In most applications it is necessary to perform more than one angled implant. For the structure shown in FIG. 3 a first and a second angled implant (represented by arrows) 61 and 62 are performed. Typically, the ions energized during the second angled implant 62 have an implant angle equal to the implant angle of the ions energized during the first angled implant 61, although it is conceivable that the two angles could be different. Still referring to FIG. 3, assume the ion accelerator is represented by device 63. In one embodiment the second angled implant 62 is performed subsequent to the first angled implant 61 by rotating the point of emission of the ion accelerator 63. In a case where the implant angle is the same for the first and second angled implants it is rotated from a first position to a second position through an arc 64 equal to twice the implant angle 60, shown in FIG. 4. In a case where the point of emission remains stationary the wafer is rotated 180 degrees. Alternately two ion accelerators may be used and the two angled implants may be performed either simultaneously or sequentially.

For example, a first angled implant 61 performed when the ion accelerator is in the first position accelerates ions to bombard the substrate. If the implant angle is 60 degrees, the point of emission must be rotated through an arc 64 equal to 120 degrees in order to attain the second position. It can be seen that a plane formed by the accelerated ions of the first angled implant 61 and a plane formed by the accelerated ions of the second angled implant 62 have an angle of intersection opposite the surface of the substrate equal to the sum of the implant angle of the first-angled implant and the implant angle of the second angled implant. By providing first and second angled implants 61 and 62, diametrically opposed vertical edges 55 and 66 of the polysilicon layer 25 and oxide layer 20 are subjected to the first and second ion implants 61 and 62 thereby creating substantially identical angled implant regions 50 and 51 in a case where the first and second implants have the same implant angle.

In addition to the first and second angled implants similar third and fourth angled implants are performed in a case where additional control layers are formed having edges which are not parallel to the edges of the control layer of the first and second angled implants. Typically, the third and fourth angled implants are used in a case where the edges of their control layer are at right angles to the edges of the control layer for the first and second angled implants. It can be seen that there can also be angled implants for any configuration of control layer.

Figure 5:
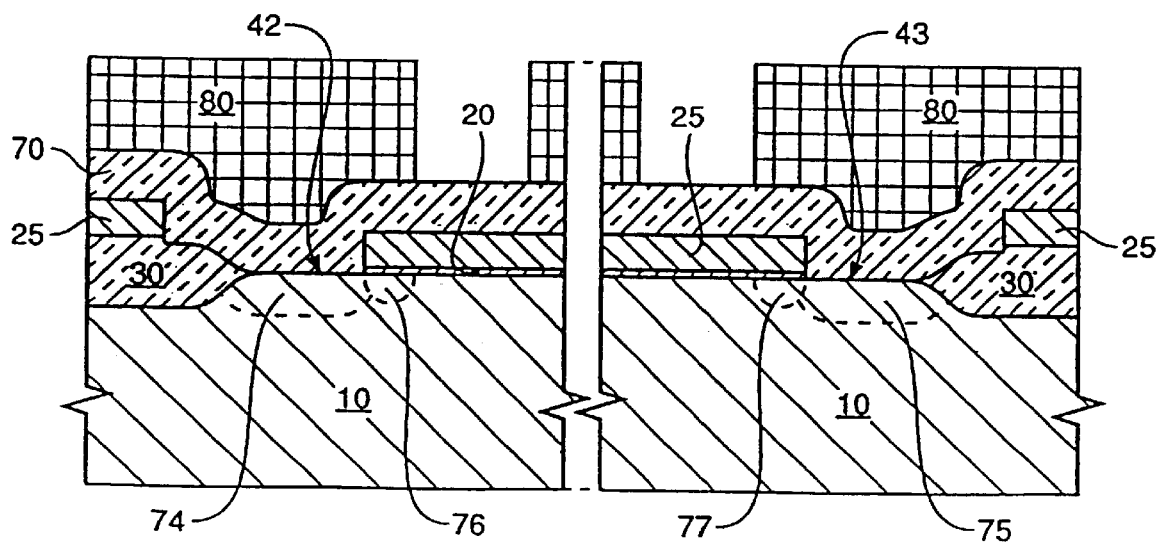
Figure 6:
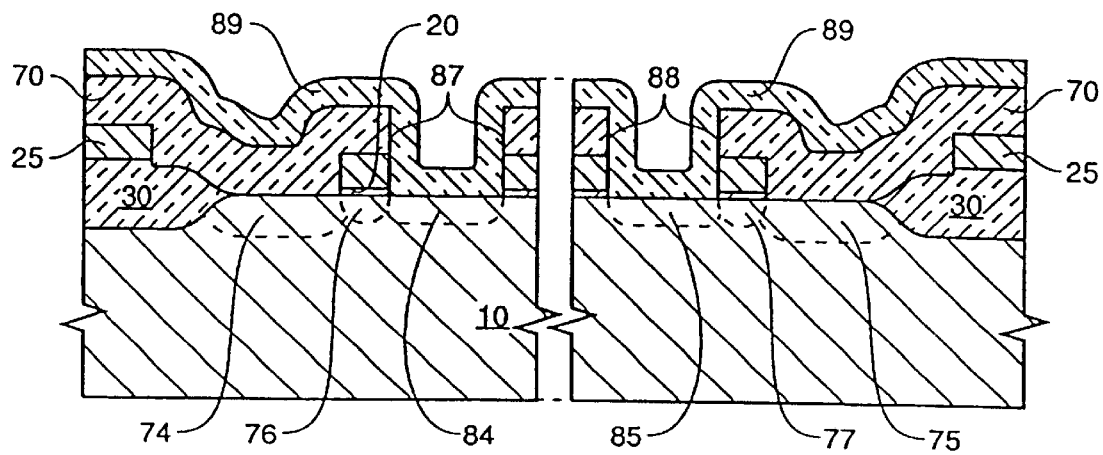
Figure 7:
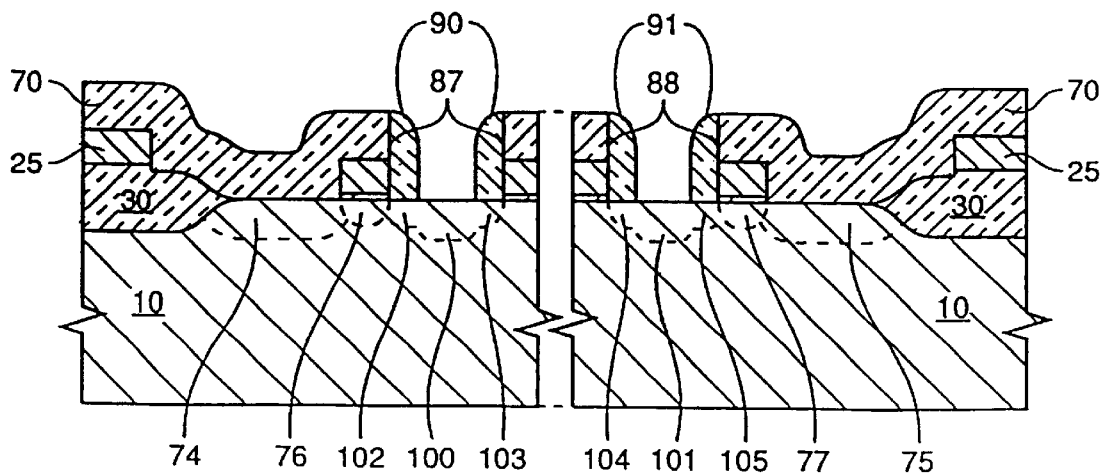

FIGS. 5–7 are simplifications showing applications of the low resistance angled implant region of the invention. The processes for forming transistor gates may take many embodiments which are not explained here. The emphasis here is an explanation of the formation of two non-overlapping electrically conductive terminals in electrical communication with an electrically conductive substrate interconnect of the invention. More particularly one embodiment for creating a source/drain region is described and one embodiment for creating a buried contact region is described. Other embodiments are equally viable alternatives to the embodiments described herein.

Now referring to FIG. 5, a second polysilicon layer 70 is deposited to overly the first polysilicon layer 25 and the exposed portions 42 and 43 of substrate 10. The second polysilicon layer 70 is doped. The dopants also penetrate layer 25. There are several doping options available to the designer. In one option the second polysilicon layer 70 is deposited doped, usually with arsenic. In a further option the second polysilicon layer 70 is deposited undoped and then later doped, either using an N-type diffusion such as phosphine or implanted with an N-type species. If implanted, the dopants are driven further into second polysilicon 70 and into first polysilicon layer 25 during an anneal. Regardless of the doping option utilized by the designer an anneal step is performed that drives the ions into the exposed portions 42 and 43 of the substrate to form an N+ region.

This newly formed N+ region in addition to the N+ area formed in the exposed portions 42 and 43 of the substrate by the angled implant defines the low resistance buried contact regions 74 and 75. The buried contact region can be thought of as the region of the substrate into which ions are diffused during the aforementioned anneal step. Indeed some of the ions may be diffused to underlie a portion of first polysilicon layer 25.

The buried contact regions 74 and 75 are in electrical communication with electrically conductive substrate interconnects 76 and 77 respectively and with the first and second polysilicon layers 25 and 70. The electrically conductive substrate interconnects 76 and 77 are the portions of the angled implant regions 50 and 51 which underlie the first polysilicon layer 25 and remain relatively electrically unchanged by the diffusion of the second polysilicon layer 70 into substrate 10. After the buried contact regions 74 and 75 are formed the combined polysilicon layers 25 and 70 are patterned with photoresist 80 to define future fabrication regions.

Alternately, polysilicon layer 70 could be doped to a P-type in a case where contact was to be made to P-type region in an N-type substrate.

Referring to FIG. 6 the first and second polysilicon layers 25 and 70 are etched according to the photoresist pattern 80 shown in FIG. 5. Using the first and second polysilicon layers 25 and 70 remaining after the etch as a mask, a light N-type ion implant, typically phosphorous, is performed. As a result of this implant terminals 84 and 85 are formed in the substrate between the vertical walls 87 and the vertical walls 88, respectively, of polysilicon layers 25 and 70 remaining after the etch. Typically, a thin spacer layer 89 is deposited before the phosphorous implant. Oxide layer 20 may be removed before this implant and a subsequent thin oxide grown, or this implant can be through oxide layer 20, in either case oxide layer 20 protects the substrate from any overetch during the etching of polysilicon layers 25 and 70.

At this stage the electrically conductive substrate interconnects 76 and 77 are in electrical communication with terminals 84 and 85, respectively and provide a low resistance path between the buried contact region 74 and terminal 84 and between the buried contact region 75 and terminal 85. Terminals 84 and 85 do not overlap the buried contact regions 74 and 75 but are in electrical communication with buried contact regions 74 and 75 through the electrically conductive substrate interconnects 76 and 77, respectively. In a case where the process is continued to form source/drain regions terminals 84 and 85 function as lightly doped drains (LDDs).

The electrically conductive substrate interconnects 76 and 77 of the invention eliminate spurious transistor effects which could result if the electrically conductive substrate interconnects were not present. For example, it can be seen that buried contact region 74 and terminal 84, without buried contact substrate interconnect 76, form a stray transistor with the first polysilicon layer 25 overlying the substrate and interposed between the buried contact region 74 and the terminal 84 functioning as a transistor gate. It can also be seen, in the example, that the electrically conductive substrate interconnect 76 depletes the transistor, thereby allowing the device to function normally.

An optional boron implant may be performed prior to the deposition of spacer layer 89 and the phosphorous implant. In this case, terminals 84 and 85 comprise small p– regions (not shown) on opposing ends of terminals 84 and 85. Thus, in the case where the boron implant was performed there would be a p– region in electrical communication with electrically conductive substrate interconnects 76 and 77.

The process can be continued, as shown in FIG. 7, to form source/drain regions. Sidewall spacers 90 and 91 are formed along the vertical walls 87 and 88, respectively. The sidewall spacers 90 and 91 are formed by any conventional means and material. Typical materials for sidewall spacers are low temperature oxide or nitride. Sidewall spacers 90 and 91 are chosen to be of a material and of sufficient height so as to prevent implanted ions from reaching the portion of surface 15 of substrate 10 which is underneath sidewall spacers 90 and 91.

After the formation of sidewall spacers 90 and 91 there is performed a heavy N-type arsenic implant to form heavily-doped N++ region 100 in substrate 10 between the sidewall spacers 90 and to form heavily-doped N++ region 101 in substrate 10 between the sidewall spacers 91. The lightly doped terminals 84 and 85 in exposed areas of the substrate are also implanted during this heavy N-type implant leaving two lightly-doped regions 102 and 103 underlying spacers 90 and leaving two lightly-doped regions 104 and 105 underlying spacers 91. A first source/drain region comprises the heavily doped N+ region 100 and the lightly doped N- regions 102 and 103, and a second source/drain region comprises the heavily doped N+ region 101 and the lightly doped N- regions 104 and 105. Electrically conductive substrate interconnect 76 is interposed between and provides electrical communication between the buried contact region 74 and the source/drain region having portions 100, 102, and 103; and electrically conductive substrate interconnect 77 is interposed between and provides electrical communication between the buried contact region 75 and the source/drain region having portions 101, 104, and 105.

The method of the invention provides a low resistance path between a buried contact region and a source/drain region without overlap of the buried contact region and the source/drain region and without the formation of a trench. Thus the junction leakage problems associated with structures having overlap of the source/drain region and the buried contact region have been eliminated thereby increasing yield and decreasing costs.

While the invention has been described in a specific embodiment, it will be apparent to those skilled in the art that the disclosed invention may be modified in numerous ways and may assume many embodiments other than those specifically set out and described above. For example, the electrically conductive substrate interconnect may provide electrical communication between the buried contact and a doped region in the substrate which has a different purpose than that of a source/drain. Although the various implants used in the method other than the angled implant are typically performed having a 0 degree implant angle, it is conceivable that implants having angles other than 0 degrees could be used in the fabrication steps. Polysilicon is the desired material for making electrical contact with the buried contact, but there maybe an equivalent material with the conformal, electrical, and dopant-migrating characteristics which could also be used. The exact depths of deposits, and growths, temperatures, pressures, dopants, etch rates and etchants used are well known to those skilled in the art. Although the invention has been described as an SRAM electrically conductive substrate interconnect formed and providing continuity between two electrically conductive regions distanced from one another such that there is no overlap of the two regions and described as the method of forming same, the circuit and method have utility in other circuits where an electrical interconnect is desired between regions without overlap of the regions. In addition variations to the method may be employed without departing from the scope of the invention. Accordingly, it is intended by the appended claims to cover all modifications of the invention which fall within the true spirit and scope of the invention.

What is claimed is:

1. A semiconductor transistor, comprising:
    a gate formed over a substrate;
    a first source/drain region in the substrate, wherein the first source/drain region is adjacent the gate;
    a second source/drain region in the substrate, wherein the second source/drain region is adjacent the gate, further wherein the second source/drain region is physically separated from the first source/drain region;
    a buried contact region in the substrate, wherein the buried contact region is physically separated from the first source/drain region; and
    an electrically-conductive substrate interconnect, wherein the electrically-conductive substrate interconnect comprises an implanted region in the substrate interposed between the buried contact region and the first source/drain region, further wherein the electrically-conductive substrate interconnect provides electrical communication between the buried contact region and the first source/drain region.

2. The semiconductor transistor of claim 1, wherein the substrate is selected from the group consisting of a silicon on insulator structure, a semiconductor substrate and a well within a semiconductor substrate.

3. The semiconductor transistor of claim 1, wherein the substrate is of a first conductivity type and the first source/drain region, the second source/drain region, the buried contact region and the electrically-conductive substrate interconnect are of a second conductivity type.

4. The semiconductor transistor of claim 3, wherein the first conductivity type and the second conductivity type are each selected from the group consisting of P-type and N-type, further wherein the second conductivity type is different from the first conductivity type.

5. A semiconductor memory device, comprising:
an arrangement of memory cells; and
at least one transistor associated with the arrangement of memory cells, wherein the at least one transistor comprises:
  a gate formed over a substrate;
  a first source/drain region in the substrate, wherein the first source/drain region is adjacent the gate;
  a second source/drain region in the substrate, wherein the second source/drain region is adjacent the gate, further wherein the second source/drain region is physically separated from the first source/drain region;
  a buried contact region in the substrate, wherein the buried contact region is physically separated from the first source/drain region; and
  an electrically-conductive substrate interconnect, wherein the electrically conductive substrate interconnect comprises an ion implanted region in the substrate interposed between the buried contact region and the first source/drain region, further wherein the electrically-conductive substrate interconnect provides electrical communication between the buried contact region and the associated source/drain region.

6. The semiconductor memory device of claim 5, wherein the substrate is selected from the group consisting of a silicon on insulator structure, a semiconductor substrate and a well within a semiconductor substrate.

7. The semiconductor memory device of claim 5, wherein the substrate is of a first conductivity type and the first source/drain region, the second source/drain region, the buried contact region and the electrically-conductive substrate interconnect are of a second conductivity type.

8. The semiconductor memory device of claim 7, wherein the first conductivity type and the second conductivity type are each selected from the group consisting of P-type and N-type, further wherein the second conductivity type is different from the first conductivity type.

9. A semiconductor memory device, comprising:
an arrangement of memory cells; and
at least one transistor associated with the arrangement of memory cells, wherein the at least one transistor is formed using a method, comprising:
  forming a patterned control layer overlying a first area of a substrate, wherein the patterned control layer has an exposed edge, further wherein the exposed edge is substantially normal to a face plane of the substrate;
  conductively doping a second area of the substrate to form a first electrically-conductive region;
  conductively doping a third area of the substrate to form a second electrically-conductive region, wherein the second electrically-conductive region is physically separated from the first electrically-conductive region; and
  implanting ions in the first area of the substrate to form a third electrically-conductive region, wherein implanting ions comprises implanting ions at an implant angle, wherein the implant angle is between 0° and 90° relative to the exposed edge of the patterned control layer, further wherein a portion of the ions enter the exposed edge of the patterned control layer prior to implanting in the first area of the substrate, still further wherein the third electrically-conductive region provides electrical communication between the first electrically-conductive region and the second electrically-conductive region.

10. The semiconductor memory device of claim 9, wherein implanting ions occurs at a time selected from the group consisting of before conductively doping a second area of the substrate, before conductively doping a third area of the substrate, after conductively doping a second area of the substrate and after conductively doping a third area of the substrate.

11. The semiconductor memory device of claim 9, wherein conductively doping a second area of the substrate comprises a process selected from the group consisting of driving ions into the second area of the substrate from a doped layer adjacent the second area of the substrate and bombarding the second area of the substrate with accelerated ions.

12. The semiconductor memory device of claim 9, wherein conductively doping a third area of the substrate comprises a process selected from the group consisting of driving ions into the third area of the substrate from a doped layer adjacent the third area of the substrate and bombarding the third area of the substrate with accelerated ions.

13. The semiconductor memory device of claim 9, wherein the method of forming the at least one transistor is performed in the order presented.

14. A semiconductor transistor, comprising:
  a gate formed over a silicon substrate having a first conductivity type;
  a first source/drain region having a second conductivity type and formed in the substrate, wherein the first source/drain region is adjacent the gate;
  a second source/drain region having the second conductivity type and formed in the substrate, wherein the second source/drain region is adjacent the gate, further wherein the second source/drain region is physically separated from the first source/drain region;
  a buried contact region having the second conductivity type and formed in the substrate, wherein the buried contact region is physically separated from the first source/drain region; and
  an electrically-conductive substrate interconnect having the second conductivity type, wherein the electrically-conductive substrate interconnect comprises an ion implanted region in the substrate interposed between the buried contact region and the first source/drain region, further wherein the electrically-conductive substrate interconnect provides electrical communication between the buried contact region and the first source/drain region;
  wherein the first conductivity type is selected from the group consisting of P-type and N-type;
  wherein the second conductivity type is the N-type when the first conductivity type is the P-type; and
  wherein the second conductivity type is the P-type when the first conductivity type is the N-type.

15. A semiconductor memory device, comprising:
an arrangement of memory cells; and
at least one transistor associated with the arrangement of memory cells, wherein the at least one transistor comprises:
  a gate formed over a silicon substrate having a first conductivity type;
  a first source/drain region having a second conductivity type and formed in the substrate, wherein the first source/drain region is adjacent the gate;
  a second source/drain region having the second conductivity type and formed in the substrate, wherein the second source/drain region is adjacent the gate, further wherein the second source/drain region is physically separated from the first source/drain region;
  a buried contact region having the second conductivity type and formed in the substrate, wherein the buried contact region is physically separated from the first source/drain region; and
  an electrically-conductive substrate interconnect having the second conductivity type, wherein the electrically-conductive substrate interconnect comprises an ion-implanted region in the substrate interposed between the buried contact region and the first source/drain region, further wherein the electrically-conductive substrate interconnect provides electrical communication between the buried contact region and the first source/drain region;
  wherein the first conductivity type is selected from the group consisting of P-type and N-type;
  wherein the second conductivity type is the N-type when the first conductivity type is the P-type; and
  wherein the second conductivity type is the P-type when the first conductivity type is the N-type.

16. A semiconductor memory device, comprising:
an arrangement of memory cells; and
at least one transistor associated with the arrangement of memory cells, wherein the at least one transistor is formed using a method, comprising:
  forming a patterned control layer overlying a first area of a silicon substrate having a first conductivity type, wherein the patterned control layer has an exposed edge, further wherein the exposed edge is substantially normal to a face plane of the substrate;
  conductively doping a second area of the substrate to form a first electrically-conductive region having a second conductivity type;
  conductively doping a third area of the substrate to form a second electrically-conductive region having the second conductivity type, wherein the second electrically-conductive region is physically separated from the first electrically-conductive region; and
  implanting ions in the first area of the substrate to form a third electrically-conductive region having the second conductivity type, wherein implanting ions comprises implanting ions at an implant angle, wherein the implant angle is between 0° and 90° relative to the exposed edge of the patterned control layer, further wherein a portion of the ions enter the exposed edge of the patterned control layer prior to implanting in the first area of the substrate, still further wherein the third electrically-conductive region provides electrical communication between the first electrically-conductive region and the second electrically-conductive region.

17. The semiconductor memory device of claim 16, wherein the method of forming the at least one transistor is performed in the order presented.

18. A semiconductor memory device, comprising:
an arrangement of memory cells; and
at least one transistor associated with the arrangement of memory cells, wherein the at least one transistor is formed using a method, comprising:
  forming a patterned control layer overlying a first area of a substrate, wherein the patterned control layer has an exposed edge, further wherein the exposed edge is substantially normal to a face plane of the substrate;
  conductively doping a second area of the substrate adjacent the exposed edge of the patterned control layer to form a buried contact region;
  implanting ions in the first area of the substrate to form an electrically-conductive substrate interconnect;
  removing a portion of the patterned control layer to expose a third area of the substrate; and
  conductively doping the third area of the substrate to form a source/drain region, wherein the source/drain region is physically separated from the buried contact region and wherein the electrically-conductive substrate interconnect is interposed between the buried contact region and the source/drain region.

19. The semiconductor memory device of claim 18, wherein the method of forming the at least one transistor is performed in the order presented.

20. The semiconductor transistor of claim 14, wherein the semiconductor substrate is a silicon on insulator structure.

21. The memory device of claim 15, wherein the semiconductor substrate is a silicon on insulator structure.

22. A transistor, comprising:
  a gate formed over a well;
  a first source/drain region in the well, wherein the first source/drain region is adjacent the gate;
  a second source/drain region in the well, wherein the second source/drain region is adjacent the gate, further wherein the second source/drain region is physically separated from the first source/drain region;
  a buried contact region in the well, wherein the buried contact region is physically separated from the first source/drain region; and
  an electrically-conductive substrate interconnect, wherein the electrically-conductive substrate interconnect includes an ion-implanted region in the well interposed between the buried contact region and the first source/drain region, further wherein the electrically-conductive substrate interconnect provides electrical communication between the buried contact region and the first source/drain region.

23. The transistor of claim 22, wherein the well is formed in one of a silicon on insulator structure and a semiconductor substrate.

24. The transistor of claim 22, wherein the well is of a first conductivity type and the first source/drain region, the second source/drain region, the buried contact region and the electrically-conductive substrate interconnect are of a second conductivity type.

25. The transistor of claim 24, wherein the first conductivity type and the second conductivity type are each selected from the group consisting of P-type and N-type, further wherein the second conductivity type is different from the first conductivity type.

26. A memory device, comprising:

an arrangement of memory cells; and at least one transistor associated with the arrangement of memory cells, wherein the at least one transistor is formed using a method, comprising:

forming a patterned control layer overlying a first area of a substrate having a first conductivity type, wherein the patterned control layer has an exposed edge, wherein the exposed edge is substantially normal to a face plane of the substrate;

conductively doping a second area of the substrate to form a first electrically-conductive region having a second conductivity type;

conductively doping a third area of the substrate to form a second electrically-conductive region having the second conductivity type, wherein the second electrically-conductive region is physically separated from the first electrically-conductive region; and implanting ions in the first area of the substrate to form a third electrically-conductive region having the second conductivity type, wherein implanting ions includes implanting ions at an implant angle, wherein the implant angle has a minimum of 60 degrees relative to the exposed edge of the patterned control layer, wherein a portion of the ions enter the exposed edge of the patterned control layer prior to implanting in the first area of the substrate, wherein the third electrically-conductive region provides electrical communication between the first electrically-conductive region and the second electrically-conductive region.

27. The memory device of claim 26, wherein the method of forming the at least one transistor is performed in the order presented.

28. The memory device of claim 26, wherein the patterned control layer has a depth of 1,000 Angstroms.

29. The memory device of claim 28, wherein the implanting ions have an energy of 45 KeV.

30. The memory device of claim 29, wherein portion of the ions implanting the first area of the substrate penetrate the substrate up to a distance of 1723 Angstroms.

31. The memory device of claim 26, wherein the implanting ions have an energy of 45 KeV.

32. The memory device of claim 26, wherein the implanting ions include phosphine.

33. A memory device, comprising:

an arrangement of memory cells; and at least one transistor associated with the arrangement of memory cells, wherein the at least one transistor is formed using a method, comprising:

forming a polysilicon, patterned control layer overlying a first area of a substrate having a first conductivity type, wherein the patterned control layer has an exposed edge, wherein the exposed edge is substantially normal to a face plane of the substrate;

conductively doping a second area of the substrate to form a first electrically conductive region having a second conductivity type;

conductively doping a third area of the substrate to form a second electrically conductive region having the second conductivity type, wherein the second electrically-conductive region is physically separated from the first electrically-conductive region; and implanting ions in the first area of the substrate to form a third electrically conductive region having the second conductivity type, wherein implanting ions comprises implanting ions at an implant angle, wherein the implant angle is between 0° and 90° relative to the exposed edge of the patterned control layer, wherein a portion of the ions enter the exposed edge of the patterned control layer prior to implanting in the first area of the substrate, wherein the third electrically-conductive region provides electrical communication between the first electrically-conductive region and the second electrically-conductive region.

34. The memory device of claim 33, wherein the method of forming the at least one transistor is performed in the order presented.

35. The memory device of claim 33, wherein the patterned control layer has a depth of 1,000 Angstroms.

36. The memory device of claim 35, wherein the implanting ions have an energy of 45 KeV.

37. The memory device of claim 36, wherein portion of the ions implanting the first area of the substrate penetrate the substrate up to a distance of 1723 Angstroms.

38. The memory device of claim 33, wherein the implanting ions have an energy of 45 KeV.

39. The memory device of claim 33, wherein the implanting ions include phosphine.

* * * * *

UNITED STATES PATENT AND TRADEMARK OFFICE
CERTIFICATE OF CORRECTION

PATENT NO. : 6,320,235 B1
DATED : November 20, 2001
INVENTOR(S) : Cheffings

It is certified that error appears in the above-identified patent and that said Letters Patent is hereby corrected as shown below:

Column 2,
Line 6, delete "increasing-yield" and insert -- increasing yield --, therefor.

Column 3,
Line 34, delete "layer-20" and insert -- layer 20 --, therefor.

Column 4,
Line 46, delete "1" and insert -- 10 --, therefor; and delete "dashed-lines" and insert -- dashed lines --, therefor.

Column 8,
Line 58, delete "implanted" and insert -- ion-implanted --, therefor.

Column 14,
Lines 12 and 21, delete "electrically conductive" and insert -- electrically-conductive --, therefor.

Column 15,
Line 15, delete "electrically conductive" and insert -- electrically-conductive --, therefor.

Signed and Sealed this

Twenty-eighth Day of May, 2002

Attest:

JAMES E. ROGAN
*Director of the United States Patent and Trademark Office*

*Attesting Officer*